United States Patent
Small et al.

(10) Patent No.: US 6,638,326 B2
(45) Date of Patent: Oct. 28, 2003

(54) COMPOSITIONS FOR CHEMICAL MECHANICAL PLANARIZATION OF TANTALUM AND TANTALUM NITRIDE

(75) Inventors: Robert J. Small, Dublin, CA (US); Maria Peterson, Belmont, CA (US); Tuan Truong, San Jose, CA (US); Melvin Keith Carter, Los Gatos, CA (US); Lily Yao, Newark, CA (US)

(73) Assignee: EKC Technology, Inc., Hayward, CA (US)

( * ) Notice: Subject to any disclaimer, the term of this patent is extended or adjusted under 35 U.S.C. 154(b) by 0 days.

(21) Appl. No.: 09/965,233

(22) Filed: Sep. 25, 2001

(65) Prior Publication Data

US 2003/0131535 A1 Jul. 17, 2003

(51) Int. Cl.$^7$ ............................ C09G 1/02; C09G 1/04; C09K 13/00; C09K 13/04; C09K 13/06
(52) U.S. Cl. ............................ 51/307; 51/308; 51/309; 106/3; 252/79.2; 252/79.4; 510/175; 510/397; 510/402
(58) Field of Search ........................... 51/307, 308, 309; 106/3; 438/692, 693; 252/79.2, 79.4, 390; 510/175, 397, 402

(56) References Cited

U.S. PATENT DOCUMENTS

| | | | |
|---|---|---|---|
| 3,137,600 A | | 6/1964 | Margulies et al. |
| 3,385,682 A | | 5/1968 | Lowen |
| 3,410,802 A | | 11/1968 | Radimer et al. |
| 3,592,773 A | | 7/1971 | Müller |
| 4,013,758 A | | 3/1977 | Osborg |
| 4,204,013 A | * | 5/1980 | Arcilesi et al. ............ 106/1.11 |
| 4,556,449 A | | 12/1985 | Nelson |
| 4,724,042 A | | 2/1988 | Sherman |
| 4,959,113 A | * | 9/1990 | Roberts ....................... 216/100 |
| 5,225,034 A | | 7/1993 | Yu et al. |
| 5,281,311 A | * | 1/1994 | Sharifian et al. ............ 205/437 |
| 5,340,370 A | | 8/1994 | Cadien et al. |
| 5,354,490 A | | 10/1994 | Yu et al. |
| 5,527,423 A | | 6/1996 | Neville et al. |
| 5,575,837 A | | 11/1996 | Kodama et al. |
| 5,614,444 A | | 3/1997 | Farkas et al. |
| 5,735,963 A | | 4/1998 | Obeng |
| 5,770,517 A | | 6/1998 | Gardner et al. |
| 5,780,358 A | | 7/1998 | Zhou et al. |
| 5,840,629 A | | 11/1998 | Carpio |
| 5,858,813 A | | 1/1999 | Scherber et al. |
| 5,863,307 A | | 1/1999 | Zhou et al. |
| 5,897,375 A | | 4/1999 | Watts et al. |
| 5,899,740 A | | 5/1999 | Kwon |
| 5,954,997 A | | 9/1999 | Kaufman et al. |
| 5,981,454 A | | 11/1999 | Small |
| 6,063,306 A | | 5/2000 | Kaufman et al. |
| 6,117,775 A | * | 9/2000 | Kondo et al. ................. 438/690 |
| 6,117,783 A | | 9/2000 | Small et al. |
| 6,140,239 A | | 10/2000 | Avanzino et al. |
| 6,149,696 A | * | 11/2000 | Jia ................................ 216/89 |
| 6,156,661 A | | 12/2000 | Small |
| 6,293,848 B1 | * | 9/2001 | Fang et al. .................. 252/79.1 |
| 6,299,795 B1 | * | 10/2001 | Liu et al. ........................ 106/3 |
| 6,398,827 B1 | * | 6/2002 | Ota et al. ....................... 106/3 |
| 6,461,227 B1 | * | 10/2002 | Fang .............................. 51/307 |
| 2001/0037821 A1 | * | 11/2001 | Staley et al. ............... 134/25.4 |
| 2002/0062600 A1 | * | 5/2002 | Mandigo et al. ............... 51/293 |

FOREIGN PATENT DOCUMENTS

| | | | |
|---|---|---|---|
| GB | 2036062 A | * | 6/1980 |
| JP | 52081692 | | 9/1993 |
| WO | 98/04646 | | 2/1998 |
| WO | 98/10050 | | 3/1998 |

OTHER PUBLICATIONS

Robert J. Small et al., "Advanced Material and Chemistries for CMP Processing," CMP World'99, Nov. 1–3, 1999, 21 pages.
Wayne Huang et al., "Dissolution of Copper and Tantalum Films in Hydroxylamine Based Silica Slurries Under CMP Conditions," The 1999 Joint International Meeting, Oct. 17–22, 1999, 11 pages.
Maria L. Peterson et al., "Challenges of Electroplated Copper Film and Device Characteristics for Copper Slurry Design," Semiconductor Fab Tech, Oct. 19, 1999, 5 pages.
Maria L. Peterson et al., "Controlling Copper Loss in Damascene Structures Through Slurry Design," 16$^{th}$ International VMIC Conference, Sep. 7–9, 1999, pp. 1–9.
Wayne Huang et al., "Copper Removal in Hydroxylamine based Slurries," 7$^{th}$ International Symposium, SCP, May 2000, 9 pages.
Robert J. Small et al., "Nitrogen–Based Slurry Development for Copper/Low–k (SiLK™) Integration," Chemical Mechanical Polishing 2001 Symposium, Oct. 2001, 15 pages.
Srini Raghavan et al., "Electrochemical Behavior of Copper and Tantalum in Silica Slurries Containing Hydroxylamine," 16$^{th}$ International VMIC Conference, Sep. 7–9, 1999, 11 pages.
Robert J. Small et al., "Nitrogen–Silica Based Slurry Development for Copper 2$^{nd}$ Step Application," 2001 VMIC Conference, LP, Nov. 28–29, 2001, 6 pages.

* cited by examiner

Primary Examiner—Michael Marcheschi
(74) Attorney, Agent, or Firm—Parsons Hsue & de Runtz LLP

(57) ABSTRACT

The present invention relates to compositions for the chemical mechanical planarization ("CMP") of barrier/adhesion layers, particularly Ta/TaN barrier/adhesion layers as occur in the manufacture of integrated circuits. CMP compositions comprise an aqueous solution of oxidizer and colloidal silica abrasive. Oxidizers include hydroxylamine nitrate, nitric acid, benzotriazole, ammonium nitrate, aluminum nitrate, hydrazine and mixtures thereof in aqueous solution.

10 Claims, No Drawings

_US 6,638,326 B2_

COMPOSITIONS FOR CHEMICAL MECHANICAL PLANARIZATION OF TANTALUM AND TANTALUM NITRIDE

BACKGROUND

1. Field of the Invention

The present invention relates generally to compositions for chemical mechanical planarization, particularly to compositions for chemical mechanical planarization of tantalum and tantalum nitride layers as occur in the manufacture of integrated circuits.

2. Description of Related Art

Modern integrated circuits typically comprise millions of active devices on a single substrate, electrically interconnected through the use of single and multilevel interconnections including conductive lines and plugs ("vias"). Conventionally, integrated circuits include a semiconductor substrate and a plurality of sequentially formed dielectric layers and conductive patterns, including conductive lines, vias and interconnects. Typically, the conductive patterns on different layers, i.e., upper and lower layers, are electrically connected by a conductive interconnect or plug filling a via opening through the interlayer dielectric ("ILD"), while a conductive plug filling a contact opening establishes electrical contact with an active region on a semiconductor substrate, such as a source/drain region. As is known in the art, a damascene technique can be employed to form interconnects by forming an opening or channel in the ILD and filling the opening with a conductive material, typically a metal. The metal typically fills the channel in the ILD and covers the field region atop the ILD between channels. Planarization typically is the next step, removing the metal in the field region, removing barrier/adhesion layers (if any), and providing a substantially planar surface for further coating and patterning.

A dual damascene technique is also known in the art and can be employed to form conductive plugs and lines simultaneously. Basically, dual damascene involves forming an opening comprising a lower contact or via opening section in communication with an upper channel section, and filling the opening and channel section with a conductive material, typically a metal, to simultaneously form an electrically connected conductive plug and channel combination. Planarization follows, to remove metal and other materials as in the damascene technique.

Elemental aluminum and its alloys have been traditionally employed for filling metallic channels and vias in the fabrication of integrated circuits having relatively low integration density. The advantages of aluminum include its low resistivity, superior adhesion to typical dielectric layers ($SiO_2$), ease of patterning, and high purity.

However, aluminum and aluminum alloys are susceptible to detrimental increases in contact resistances during high temperature processing. Another problem associated with the use of aluminum and aluminum alloys in integrated circuits is electromigration, which becomes a more serious concern as the level of integration and the density of components increase. The higher number of circuit components in very large-scale integration ("VLSI"), ultra large-scale integration, ("ULSI") and even higher densities, requires the use of conductive interconnects with smaller cross sections. This causes higher electrical resistance in the interconnect and heat generation. Accordingly, as integrated circuit patterning schemes continue to miniaturize to submicron dimensions, aluminum based metallurgies have become increasingly marginal for handling the increased circuit speed and current density requirements. Materials having higher conductivity than aluminum or its alloys would be advantageous as interconnects. Hence, the escalating requirements for high density and performance associated with VLSI, ULSI and beyond require responsive changes in multilevel interconnection technology.

Currently, copper and copper alloys deposited on a tantalum (Ta) and/or tantalum nitride (TaN) adhesion/barrier layer are receiving considerable attention as replacement materials for, inter alia, aluminum and aluminum alloys in VLSI and ULSI multilevel metallization systems. Copper has a lower resistivity than aluminum, and also significantly higher resistance to electromigration. However, problems with integrating copper metal into multilevel metallization systems include the difficulty of etching copper and its relatively high diffusivity. Since copper is difficult to pattern precisely and economically, damascene or dual damascene processing is typically preferred over subtractive processes for creating copper interconnections. To hinder copper diffusion and to enhance its adhesion, barrier/adhesion layers (typically Ta/TaN) are used to separate the copper interconnections from the surrounding dielectric and to enhance the adhesion of the copper. However, these multicomponent layered structures of Cu/Ta/TaN/ILD exacerbate the problems of providing smooth surfaces for accurate patterning, while accurate patterning is increasingly necessary for providing reliable electrical contact to submicron features.

Chemical Mechanical Planarization (also referred to as Chemical Mechanical Polishing), or CMP, is the process of removing material and forming a substantially planar layer before additional layers are deposited and/or additional patterning occurs. CMP of copper and copper alloys deposited on a tantalum (Ta) and/or tantalum nitride (TaN) barrier/adhesion layer has become the subject of considerable interest. For economy of language, we refer to copper and/or copper alloys as "copper" and barrier/adhesion layer(s) as "barrier layer," understanding thereby that the copper conductor may include copper alloys (among other materials) and the barrier layer may have adhesive as well as barrier functions. Slurries previously employed in the CMP processes of copper layers, barrier layers and/or insulating layers have suffered from several disadvantages, including an inadequate selectivity between removal rates of copper, barrier and insulating materials. The selectivity in the removal of copper and barrier materials should be neither too high nor too low. Uncontrollable removal rates can be the undesirable result. Over-polishing of some materials in order to remove other materials may also occur when selectivity is too high. Over-polishing can lead to significant degradation, dishing or erosion of the surface being over-polished and consequently poor planarization.

Furthermore, current polishing slurries employed in these CMP processes have suffered from poor nonuniformity values. Nonuniformity is a known way to quantify the uniformity of material removal rate on many points over a wafer. For example, pre-CMP thickness measurements are typically taken by measuring selected points on each wafer and then, post-CMP thickness measurements are taken at the same points. Nonuniformity is then calculated from the following formula:

$$\text{Nonuniformity}(\text{"NU"})\% = 100 \, [\sigma(\Delta_i)/\text{ave}(\Delta_i)] \qquad \text{Eq. 1.}$$

Where $\Delta_i$=thickness of the material removed from point i on the wafer.

$\sigma(\Delta_i)$=standard deviation of all $\Delta_i$ values on the wafer.

$\text{ave}(\Delta_i)$=mean of all $\Delta_i$ values on the wafer.

The set of $\Delta_i$'s are equal to the thickness removed or the pre-CMP thickness minus the post-CMP thickness for each of the measured points, i. Typically, good nonuniformity values are less than 5% for CMP of conductors. CMP of barrier layers is considered acceptable if NU values less than about 23% are achieved.

For the foregoing reasons, among others, there is a need for CMP slurry compositions that, inter alia, planarize or polish copper and Ta and/or TaN barrier layers at desirable high polishing rates while minimizing surface imperfections, defects, corrosion, dishing and erosion. Particularly, there is a need for one or more CMP slurry compositions that provide good selectivity between copper and barrier removal rates while providing good nonuniformity values. Additionally, there is a need for one or more CMP slurry compositions that provide a high copper removal rate and a low Ta and/or TaN barrier removal rate while avoiding significant degradation, dishing or erosion. Thus, ideally, there is a need for a "phase-one" or a first chemical mechanical planarization or polishing slurry for use in connection with copper damascene or dual damascene processes that removes the copper from the field region between the copper-containing interconnects and stops planarizing when the barrier layer is reached. The phase-one CMP slurry is the subject of a patent application entitled "Compositions for Chemical Mechanical Planarization of Copper" by the same inventors as herein and co-filed herewith.

We refer to wafers having copper deposited thereon as in a damascene or dual damascene process as "copper wafers," understanding that excess field region copper is to be removed by the CMP process. Following removal of the field region copper and exposure of the barrier layer in the phase-one CMP process, the barrier layer is then removed to complete the planarization. Different processing conditions and/or different CMP compositions are typically employed for the removal of the barrier layer. The removal of the barrier layer or the "phase-two" CMP process is the general subject of the present invention We consider two general classes of CMP processes for the polishing of copper wafers. The first process employs a copper single-step slurry process involving a single chemical composition of the CMP slurry throughout the planarization that removes both the copper and barrier materials. This first CMP process is typically continuous, but polishing steps can be divided into as many sub-steps as needed by varying polishing pressure, speeds and other processing parameters. In general, a CMP processing step employing high polishing pressure can remove copper topography and planarize the surface efficiently. Subsequently, a step is employed using lower polishing pressure to remove the remaining copper substantially uniformly and continuing to remove barrier layer (tantalum/tantalum nitride or tungsten (W), among others) with a lower removal rate.

The second general class of CMP processes involves a phase-one and phase-two copper CMP process including two separate polishing steps using two separate polishing slurry compositions. Phase-one slurry (or the first CMP step), typically containing oxidizer and abrasive, is designed to planarize copper topography quickly and then continue to remove the copper metal, reaching the barrier layer, while maintaining good uniformity. In the phase-two step, a slurry with an oxidizer is typically used to remove the barrier layer (TaN or Ta).

The present invention is directed to a phase-two or a chemical mechanical planarization or polishing slurry that is able to selectively polish the Ta/TaN adhesion/barrier layer following removal of the copper portion in the phase-one CMP process.

The present invention relates to compositions for the chemical mechanical planarization ("CMP") of adhesion/barrier layers, particularly Ta/TaN adhesion barrier layers overlying dielectric materials as occur in the fabrication of integrated circuits. Various CMP compositions including an abrasive, at least one oxidizer and at least one nitrate are shown to give good CMP selectivity between Ta and the dielectric as well as good CMP selectivity between TaN and the dielectric. CPM compositions pursuant to various embodiments of the present invention include high planarization rates of Ta and TaN with reduced dishing and erosion. Good nonumiformity values are also demonstrated. CMP compositions comprise an aqueous solution of oxidizer and colloidal silica abrasive. Oxidizers include hydroxylamine nitrate, nitric acid, benzotriazole, ammonium nitrate, aluminum nitrate, hydrazine and mixtures thereof in aqueous solution.

DESCRIPTION OF THE DRAWINGS

This application has no drawings.

DETAILED DESCRIPTION

The phase-two polishing slurries described herein are employed for the removal of Ta/TaN adhesion/barrier layers following removal of field region copper. As the Ta/TaN layers directly contact the ILD layer, good selectivity between Ta/TaN removal and ILD removal is advantageous for phase-two processes.

The present invention ameliorates or overcomes one or more of the shortcomings of the prior art by providing CMP slurry compositions that have one or more of the following characteristics: 1) Having an improved Ta/ILD and/or TaN/ILD selectivity. 2) Having a low removal rate for the ILD. 3) Having the ability to planarize the Ta/TaN layer at desired high planarization rates while reducing Ta/TaN dishing and erosion. 4) Having good nonuniformity values (less than about 23%).

In some embodiments, the present invention provides a phase-two chemical mechanical planarization slurry that is able to selectively planarize the Ta/TaN portion of a copper and tantalum and/or a tantalum nitride layer. In some embodiments of the present invention, the phase-two chemical mechanical planarization slurry includes an oxidizer, one or more nitrates and at least one abrasive. Some embodiments include nitrates that also function as the oxidizer. That is, the oxidizer may, but need not, be a distinct chemical species from the nitrate. However, for economy of language we typically refer to the oxidizer and the nitrate, understanding throughout that they are not necessarily distinct chemical species.

One of the nitrate compositions pursuant to some embodiments of the present invention is in the form of hydroxylamine nitrate ($NH_2OH \cdot HNO_3$, "HAN"). HAN serves as a mild oxidizing agent, having a pH of about 2.1 to about 3.2 and includes a nitrate anion that provides good removal rate controllability of the tantalum and/or tantalum nitride barrier patterned with copper (for example). Additionally, the pH of the HAN can be adjusted by adding various types of acid, including nitric acid and/or any other inorganic acid that is chemically compatible with HAN. The HAN pH can also be adjusted by the addition of various nitrates including ammonium nitrate, aluminum nitrate, or other soluble inorganic or organic nitrate salts that are chemically compatible with HAN, and mixtures thereof.

Hydroxylamine nitrate is employed to control the rate at which the barrier layer is planarized. That is, increasing the concentration of HAN in the CMP slurry typically results in higher TaN removal rate while having no significant effect on the Cu removal rate. This tends to increase the selectivity of Cu removal with respect to TaN. HAN may be combined with other nitrates (including ammonium nitrate, aluminum nitrate, or other soluble inorganic or organic nitrate salts that are chemically compatible with HAN and mixtures thereof) and/or acids (nitric, and/or any other inorganic acid that is chemically compatible with HAN) to obtain advantageous barrier removal rates, uniformity and selectivity. Aluminum nitrate, ammonium nitrate and nitric acid may all be used to modify the pH of the CMP slurry containing HAN such that acidic conditions are maintained and, thus, function as oxidizers.

Furthermore, and pursuant to some embodiments of the present invention, the phase-two CMP slurries may include benzotriazole (aziminobenzene, $C_6H_4NHN_2$, "BTA"). Benzotriazole is typically employed as a corrosion inhibitor for controlling the chemical etching of metal conductors, lines and interconnects (e.g copper).

The CMP phase-two slurry compositions for Ta/TaN barrier removal and polishing are delineated in detail as follows.

Phase-Two CMP Slurry Compositions

In some embodiments, the present invention includes an oxidizer and an abrasive composition.

Oxidizers

Oxidizer Components ("Oxidizer A")

One oxidizer ("Oxidizer A") pursuant to some embodiments of the present invention includes hydroxylamine nitrate, nitric acid and distilled or de-ionized water (collectively referred to herein as "DI water"). One example of approximate component concentrations for Oxidizer A is shown in Table $A_x$.

TABLE $A_x$

Typical composition for Oxidizer A:

| Component | Component Concentration (Weight Percent) |
|---|---|
| Hydroxylamine Nitrate (@ 82% solution) | 3.0% |
| Nitric Acid (@ 28% solution) | 0.08% |
| DI water | 96.92% | pH Range

Oxidizer A is advantageously adjusted to have a pH range from about 2.6 to about 2.7 by the addition of an appropriate amount of acid as described above.

Oxidizer Components ("Oxidizer B")

Another oxidizer ("Oxidizer B") pursuant to some embodiments of the present invention includes hydroxylamine nitrate, benzotriazole, nitric acid and DI water. One example of approximate component concentrations for Oxidizer B is shown in Table $B_x$.

TABLE $B_x$

Typical composition for Oxidizer B:

| Component | Component Concentration (Weight Percent) |
|---|---|
| Hydroxylamine nitrate (@ 82% solution) | 1.2% |
| Benzotriazole (@ 0.2% solution) | 8.0% |

TABLE $B_x$-continued

Typical composition for Oxidizer B:

| Component | Component Concentration (Weight Percent) |
|---|---|
| Nitric acid (@ 28% solution) | 0.024% |
| DI water | 90.776% | pH Range

Oxidizer B is advantageously adjusted to have a pH range from about 2.8 to about 2.9 by the addition of an appropriate amount of acid as described above.

Oxidizer Components ("Oxidizer C")

Another oxidizer ("Oxidizer C") according to some embodiments of the present invention includes ammonium nitrate ($NH_4NO_3$), benzotriazole and DI water. One example of approximate component concentrations for Oxidizer C is shown in Table $C_x$.

TABLE $C_x$

Typical composition for Oxidizer C:

| Component | Component Concentration (Weight Percent) |
|---|---|
| Ammonium Nitrate (solid) | 6.0% |
| Benzotriazole (@ 0.2% solution) | 0.6% |
| DI water | 93.4% | pH Range

Oxidizer C is advantageously adjusted to have a pH range from about 5.1 to about 5.5 by the addition of an appropriate amount of acid as described above.

Oxidizer Components ("Oxidizer D")

Another oxidizer ("Oxidizer D") according to some embodiments of the present invention includes aluminum nitrate [$Al(NO_3)_3$] and DI water. One example of approximate component concentrations for Oxidizer D is shown in Table $D_x$.

TABLE $D_x$

Typical composition for Oxidizer D:

| Component | Component Concentration (Weight Percent) |
|---|---|
| Aluminum Nitrate (solid) | 6.0% |
| DI Water | 94% | pH Range

Oxidizer D is advantageously adjusted to have a pH range from about 5.1 to about 5.5 by the addition of an appropriate amount of acid as described above.

Oxidizer Components ("Oxidizer E")

Another oxidizer ("Oxidizer E") according to some embodiments of the present invention includes hydrazine, benzotriazole, ammonium nitrate and DI water. The present Phase-two CMP slurry compositions may be used following a phase-one CMP employing hydrogen peroxide $H_2O_2$. Typically, when hydrogen peroxide is a component of a phase-one slurry, a reside of the hydrogen peroxide remains on the surface of the wafer after polishing that can cause excessive dishing and erosion. Hydrazine-containing oxidizers ameliorate these problems associated with the presence of hydrogen peroxide.

One example of approximate component concentrations for Oxidizer E is shown in Table $E_x$.

TABLE E$_x$

Typical composition for Oxidizer E

| Component | Component Concentration (Weight Percent) |
| --- | --- |
| Ammonium Nitrate (solid) | 3.0% |
| Benzotriazole (@ 0.2% solution) | 0.006% |
| Hydrazine Solution NH$_2$NH$_2$·H$_2$O | 0.5% |
| DI water | 96.494% | pH Range

Oxidizer E is advantageously adjusted to have a pH range from about 5.7 to about 6.5 by the addition of an appropriate amount of acid as described above.

Abrasives

Abrasive Components ("Abrasive A")

One abrasive ("Abrasive A") according to some embodiments of the present invention comprises colloidal silica. One advantage of using colloidal silica as an abrasive in the phase-two planarization process is that the colloidal silica can serve a dual function: as an abrasive and also as a built-in buffer leading to an oxide buffing action simultaneously with the CMP. Thus, in some cases in might be possible to eliminate a third polishing step to buff the oxide in lieu of the simultaneous polishing occurring through CMP containing a colloidal silica abrasive. An example of Abrasive A is shown in the Table A$_a$.

TABLE A$_a$

Typical Composition for Abrasive A

| Type | Colloidal silica |
| --- | --- |
| Concentration Weight Percent | 33.5-25% |
| Particle Size (range) | 20-150 nanometers |
| Particle Size (average) | 71-73 nanometers |
| Commercial Source | Dupont: DP106 |

In one embodiment, Abrasive A can be of the type which is manufactured by Dupont and sold under the name, DP 106 and further processed (milled and filtered) by EKC Technology, Inc. and sold thereby under the name, MicroPlanar™ CMP9000™. The colloidal silica, in this example, has a particle size having a range between about 20 and 150 nanometers and includes an average particle size having a range between about 71 to 73 nanometers. A Material Safety Data Sheet for MicroPlanar™ CMP9000™ is attached hereto and incorporated herein.

pH Ranges

The processed silica has a pH range from about 8.1 to about 8.5.

Abrasive Components ("Abrasive B")

Another abrasive composition ("Abrasive B") according to some embodiments of the present invention comprises colloidal silica with different particle sizes than Abrasive A. One example of Abrasive B is shown in Table B$_a$.

TABLE B$_a$

Typical Composition for Abrasive B

| Type | Colloidal Silica |
| --- | --- |
| Concentration Weight Percent | 20 wt. % |
| Particle Size (range) | 40-150 nanometers |
| Particle Size (average) | 60 nanometers |
| Source | DP106 |

In one embodiment, Abrasive B can be of the type that is manufactured by DuPont and sold under the name, DP106 and further processed by EKC Technology, Inc. and sold thereby under the name, MicroPlanar™ CMP9003™. The colloidal silica in Abrasive B has a particle size having a range between about 40 and about 150 nanometers and includes an average particle size of approximately 60 nanometers. A Material Safety Data Sheet for MicroPlanar™ CMP9003™ is attached hereto and incorporated herein.

Barrier/Adhesion Layer CMP Slurry Compositions

Phase-Two CMP Slurry Composition ("Slurry 1 Composition")

Some embodiments of the present invention comprise Oxidizer A and Abrasive A mixed to form a Slurry 1 Composition. In one example, and according to some embodiments of the present invention, the mixing ratio, process and removal rate data for the Slurry 1 Composition is shown in the Table 1.

TABLE 1

Slurry 1 Composition: Mixing Ratio, Process and Removal Rate

| | | Removal Rate (Å/min) | | | | | |
| --- | --- | --- | --- | --- | --- | --- | --- |
| Mixing Ratio | Process | Cu | NU % | TaN | NU % | ILD | NU % |
| 90% Oxidizer A 10% Abrasive A | 3/0/70/81 | 921 | 13.8% | 359 | 15.75% | 127 | 24.7% |

In Table 1, the Slurry 1 Composition is comprised of 10% of Abrasive A and 90% of Oxidizer A. The process delineated with respect to the Slurry 1 Composition is achieved by applying 3 psi down force pressure, 0 psi back pressure, 70 rpm table speed (22.5 inch diameter) and 81 rpm carrier speed (8 inch diameter). The Slurry 1 Composition, when employed according to the above process, provides a Cu:TaN selectivity of approximately 2.56 (removal rate of Cu divided by the removal rate of TaN) and a copper nonuniformity (NU%) of approximately 13.8%. The Slurry 1 Composition provides a TaN:ILD selectivity of approximately 2.83, a TaN nonuniformity of approximately 15.75% and an ILD nonuniformity of approximately 24.7%.

Phase-Two Slurry Composition ("Slurry 2 Composition")

Other embodiments of the present invention include Oxidizer B and Abrasive A mixed to form a Slurry 2 Composition. In one example, and according to some embodiments of the present invention, the mixing ratio, process and removal rate data for the Slurry 2 Composition is shown in Table 2.

TABLE 2

Slurry 2 Composition: Mixing Ratio, Process and Removal Rate

| | | Removal Rate (Å/min) | | | | | |
|---|---|---|---|---|---|---|---|
| Mixing Ratio | Process | Cu | NU % | TaN | NU % | ILD | NU % |
| 50% Oxidizer B 15% Abrasive A 35% DI Water | 1.8/0/75/75 | 982 | 10.9% | 1200 | 9.3% | 300 | 12.7% |

In Table 2, the Slurry 2 Composition is comprised of 15% of Abrasive A and 50% of Oxidizer B and 35% DI water. The process delineated with respect to the Slurry 2 Composition is achieved by applying 1.8 psi down force pressure, 0 psi back pressure, 75 rpm table speed (22.5 inch diameter) and 75 rpm carrier speed (8 inch diameter). The Slurry 2 Composition, when employed according to the above process, provides a Cu:TaN selectivity of approximately 0.82 and a copper nonuniformity (NU%) of approximately 10.9%. The Slurry 2 Composition provides a TaN:ILD selectivity of approximately 4, a TaN nonuniformity of approximately 9.30% and an ILD nonuniformity of approximately 12.7%.

Phase-Two Slurry Composition ("Slurry 3 Composition")

Other embodiments of the present invention include Oxidizer C, Abrasive A and DI water mixed to form a Slurry 3 Composition. In one example, and according to some embodiments of the present invention, the mixing ratio, process and removal rate data for the Slurry 3 Composition is shown in Table 3.

In Table 3, the Slurry 3 Composition is comprised of 10% of Abrasive A, 50% of Oxidizer C and 40% DI water. The process delineated with respect to the Slurry 3 Composition is achieved by applying 1.8 psi down force pressure, 0 psi back pressure, 75 rpm table speed (22.5 inch diameter) and 75 rpm carrier speed (8 inch diameter). The Slurry 3 Composition, when employed according to the above process, provides a Cu:TaN selectivity of approximately 0.38 and a copper nonuniformity (NU%) of approximately 23.0%. The Slurry 3 Composition provides a TaN:ILD selectivity of approximately 3.25, a TaN nonuniformity of approximately 15% and an ILD nonuniformity of approximately 20%.

Phase-Two CMP Slurry Composition ("Slurry 4 Composition")

Some embodiments of the present invention include Oxidizer C, Abrasive A and DI water mixed to form a Slurry 4 Composition. In one example, and according to some embodiments of the present invention, the mixing ratio, process and removal rate data for the Slurry 4 Composition is shown in the Table 4.

TABLE 3

Slurry 3 Composition: Mixing Ratio, Process and Removal Rate

| | | Removal Rate (Å/min) | | | | | |
|---|---|---|---|---|---|---|---|
| Mixing Ratio | Process | Cu | NU % | TaN | NU % | ILD | NU % |
| 50% Oxidizer C 10% Abrasive A 40% DI Water | 1.8/0/75/75 | 248 | 23.0% | 650 | 15% | 200 | 20% |

TABLE 4

Slurry 4 Composition: Mixing Ratio, Process and Removal Rate

| | | Removal Rate (Å/min) | | | | | |
|---|---|---|---|---|---|---|---|
| Mixing Ratio | Process | Cu | NU % | TaN | NU % | ILD | NU % |
| 30% Oxidizer C 20% Abrasive A 50% DI Water | 3/0/60/60 | 605 | 17% | 1000 | 10% | 884 | 15% |

In Table 4, the Slurry 4 Composition is comprised of 20% of Abrasive A and 30% of Oxidizer C and DI water. The process delineated with respect to the Slurry 4 Composition is achieved by applying 3 psi down force pressure, 0 psi back pressure, 60 rpm table speed (22.5 inch diameter) and 60 rpm carrier speed (8 inch diameter). The Slurry 4 Composition, when employed according to the above process, provides a Cu:TaN selectivity of approximately 0.61 and a copper nonuniformity (NU%) of approximately 17%. The Slurry 4 Composition provides a TaN:ILD selectivity of approximately 1.13, a TaN nonuniformity of approximately 10% and an ILD nonuniformity of approximately 15%.

Phase-Two Slurry Composition ("Slurry 5 Composition")

Other embodiments of the present invention include Oxidizer D, Abrasive A and DI water mixed to form a Slurry 5 Composition. In one example, and according to some embodiments of the present invention, the mixing ratio, process and removal rate data for the Slurry 5 Composition is shown in Table 5.

TABLE 5

Slurry 5 Composition: Mixing Ratio, Process and Removal Rate

| Mixing Ratio | Process | Removal Rate (Å/min) | | | | |
|---|---|---|---|---|---|---|
| | | Cu | NU % | TaN | NU % | ILD | NU % |
| 50% Oxidizer D 10% Abrasive A 40% DI Water | 1.8/0/75/75 | 253 | 22.4% | 525 | 25.7% | 200 | 12.7% |

In Table 5, the Slurry 5 Composition is comprised of 10% of Abrasive A, 50% of Oxidizer D and 40% DI water. The process delineated with respect to the Slurry 5 Composition is achieved by applying 1.8 psi down force pressure, 0 psi back pressure, 75 rpm table speed (22.5 inch diameter) and 75 rpm carrier speed (8 inch diameter). The Slurry 5 Composition, when employed according to the above process, provides a Cu:TaN selectivity of approximately 0.48 and a copper nonuniformity of approximately 22.4%. The Slurry 5 Composition provides a TaN:ILD selectivity of approximately 2.6, a TaN nonuniformity of approximately 25.7% and an ILD nonuniformity of approximately 12.7%.

Phase-Two Slurry Composition ("Slurry 6 Composition")

Other embodiments of the present invention include Oxidizer E, Abrasive B and DI water mixed to form a Slurry 6 Composition. In one example, and according to some embodiments of the present invention, the mixing ratio, process and removal rate data for the Slurry 6 Composition is shown in Table 6.

TABLE 6

Slurry 6 Composition: Mixing Ratio, Process and Removal Rate

| Mixing Ratio | pH | Mean Removal Rate (A/min) | | Copper Patterned Wafer | |
|---|---|---|---|---|---|
| | | Cu | TaN | Dishing (Angstroms) | Erosion (Angstroms) |
| 37.4% Oxidizer E 17% Abrasive B 45.6% DI water | 5.1–5.5 | 186 | 1100 | 600 | 389 |

In Table 6, the Slurry 6 Composition is comprised of 17% of Abrasive B, 34.7% of Oxidizer E and 45.6% DI water. The Slurry 6 Composition, when employed according to the above process, provides a Cu:TaN selectivity of approximately 0.169. The process delineated with respect to the Slurry 6 Composition is achieved by applying 2.0 psi down force pressure, 0 psi back pressure, 70 rpm table speed (22.5 inch diameter) and 75 rpm carrier speed (8 inch diameter).

Table 6 further shows a performance difference between the Slurry 6 Composition and a current commercial phase II slurry comprising an oxidizer and an abrasive sold by EKC Technology, Inc. under the respective names of, MicroPlanar™ CMP9011™ (oxidizer) and MicroPlanar™ CMP9003™ (abrasive). As is shown in the above table, the Slurry 6 Composition reduces dishing to approximately 600 angstroms and also reduces erosion to approximately 389 angstroms.

Phase-Two Slurry Composition ("Slurry 7 Composition")

Other embodiments of the present invention include Oxidizer B, Abrasive B and DI water mixed to form a Slurry 7 Composition. In one example, and according to some embodiments of the present invention, the mixing ratio, process and removal rate data for the Slurry 7 Composition is shown in Table 7.

TABLE 7

Slurry 7 Composition: Mixing Ratio, Process and Removal Rate

| Mixing Ratio | Process | Removal Rate (A/min) | | |
|---|---|---|---|---|
| | | Cu | TaN | ILD |
| 50% Oxidizer B 25% Abrasive B 25% DI water | 3/0/70/75 | 276 | 1444 | 120 |

In Table 7, the Slurry 7 Composition is comprised of 25% of Abrasive B, 50% of Oxidizer B and 25% DI water. The process delineated with respect to the Slurry 7 Composition is achieved by applying 3 psi down force pressure, 0 psi back pressure, 70 rpm table speed (22.5 inch diameter) and 75 rpm carrier speed (8 inch diameter). The Slurry 7 Composition, when employed according to the above process, provides a Cu:TaN selectivity of approximately 0.20 and a TaN:ILD selectivity of approximately 12.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

We claim:

1. A composition for chemical mechanical planarization of tantalum/tantalum nitride barrier/adhesion layers, comprising an aqueous oxidizer comprising hydroxylamine nitrate in an amount of approximately 1.2% of an approximately 82% solution, nitric acid in an amount of approximately 0.024% of an approximately 28% solution, and benzotriazole in an amount of approximately 8.0% of a 0.2% solution.

2. The composition of claim 1 wherein said aqueous oxidizer comprises sufficient acid such that a pH of said aqueous oxidizer in a range from approximately 2.8 to approximately 2.9.

3. A composition for chemical mechanical planarization of tantalum/tantalum nitride barrier/adhesion layers comprising:

an aqueous oxidizer comprising hydroxylamine nitrate in an amount of approximately 1.2% of an approximately 82% solution, nitric acid in an amount of approximately 0.024% of an approximately 28% solution, benzotriazole in an amount of approximately 8.0% of a 0.2% solution, and sufficient acid such that a pH of said aqueous oxidizer is in a range of from approximately 2.8 to approximately 2.9; and an aqueous colloidal silica abrasive comprising approximately 25 weight percent to approximately 33.5 weight percent colloidal silica having a particle size in a range from approximately 20 nanometers to approximately 150 nanometers and having an average particle size in a range from approximately 71 nanometers to approximately 73 nanometers;

said composition comprising approximately 50% of said aqueous oxidizer and approximately 15% of said aqueous colloidal silica.

4. A composition for chemical mechanical planarization of tantalum/tantalum nitride barrier/adhesion layers, said composition comprising:

an aqueous oxidizer comprising approximately 3.0% ammonium nitrate, benzotriazole in an amount of approximately 0.006% of an approximately 0.2% solution, and approximately 0.5% of hydrazine solution.

5. The composition of claim 4 wherein said aqueous oxidizer comprises sufficient acid such that a pH of said aqueous oxidizer is in a range from approximately 5.7 to approximately 6.5.

6. The composition of claim 4 further comprising an abrasive.

7. The composition of claim 6 wherein said abrasive is aqueous colloidal silica.

8. The composition of claim 7 wherein said aqueous colloidal silica comprises approximately 20 weight percent colloidal silica having a particle size in a range from approximately 40 nanometers to approximately 150 nanometers and having an average particle size of approximately 60 nanometers.

9. A composition for chemical mechanical planarization of tantalum/tantalum nitride barrier/adhesion layers, comprising:

an aqueous oxidizer comprising approximately 3.0% ammonium nitrate, benzotriazole in an amount of approximately 0.006% of an approximately 0.2% solution, approximately 0.5% of hydrazine solution, and sufficient acid such that a pH of said aqueous oxidizer is in a range from approximately 5.7 to approximately 6.5; and an aqueous colloidal silica abrasive comprising approximately 20 weight percent colloidal silica having a particle size in a range from approximately 40 nanometers to approximately 150 nanometers and having an average particle size of approximately 60 nanometers;

said composition comprising approximately 37.4% of said aqueous oxidizer -and approximately 17%.of said aqueous colloidal silica.

10. A composition for chemical mechanical planarization of tantalum/tantalum nitride barrier/adhesion layers, comprising:

an aqueous oxidizer comprising hydroxylamine nitrate in an amount of approximately 1.2% of an approximately 82% solution, nitric acid in an amount of approximately 0.024% of an approximately 28% solution, benzotriazole in an amount of approximately 8.0% of an approximately 0.2% solution, and sufficient acid such that a pH of said aqueous oxidizer is in a range of from approximately 2.8 to approximately 2.9; and aqueous colloidal silica abrasive comprising approximately 20 weight percent colloidal silica having a particle size in the range from approximately 40 nanometers to approximately 150 nanometers and having an average particle size of approximately 60 nanometers;

said composition comprising approximately 50% of said aqueous oxidizer and approximately 25% of said aqueous colloidal silica.

* * * * *